(12) United States Patent
Taylor

(10) Patent No.: US 6,236,695 B1
(45) Date of Patent: May 22, 2001

(54) OUTPUT BUFFER WITH TIMING FEEDBACK

(75) Inventor: Gregory F. Taylor, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/316,352

(22) Filed: May 21, 1999

(51) Int. Cl.[7] .................... H04L 25/36; H04L 25/40; H04L 7/00

(52) U.S. Cl. .................... 375/372; 375/375; 327/158

(58) Field of Search .................... 375/375, 372; 327/153, 161, 158, 149, 244; 713/401; 710/61

(56) References Cited

U.S. PATENT DOCUMENTS 4,899,071 * 2/1990 Morales .................... 327/277
5,815,017 * 9/1998 McFarland .................... 327/158

OTHER PUBLICATIONS wolff et al., "Microwave Engineering and Systems Applications", p. 69, published by John Wiley & Son, 1988.*

* cited by examiner

Primary Examiner—Chi Pham
Assistant Examiner—Phuong Phu
(74) Attorney, Agent, or Firm—Schwegman, Lundberg, Woessner & Kluth, P.A.

(57) ABSTRACT

An output buffer circuit includes an adjustable delay time and is coupled to a reference output buffer which includes an adjustable delay time and a fixed delay time. In one embodiment, a synchronous delay line circuit provides a reference signal having a predetermined delay time. The time delay is equal to 1/N of a clock signal cycle. The reference output buffer uses the reference signal to set a cumulative delay time for the reference output buffer equal to 1/N. The adjustable delay time of the output buffer is set equal to the adjustable time delay of the reference output buffer.

19 Claims, 5 Drawing Sheets

US 6,236,695 B1

OUTPUT BUFFER WITH TIMING FEEDBACK

TECHNICAL FIELD OF THE INVENTION

The present invention relates generally to integrated circuit output buffers and in particular the present invention relates to integrated circuit output buffer control circuitry.

BACKGROUND OF THE INVENTION

Integrated circuits can be connected to an external communication line, or bus, and traditionally include an output buffer, or driver circuit. An output buffer is typically characterized by a delay time experienced from applying a clock signal to an input of the buffer until valid data is provided at an output. This delay time is often referred to as Tco (time from clock to output). The performance of an integrated circuit/data line communication system is limited (among other things) by the variation in Tco. In general, if Tco is too long then the system operating frequency is reduced to allow time for the driven output to arrive at and set up a receiver connected to a remote end of the communication bus. If the delay is too short, the output may arrive at the receiver too quickly. Thus, variations in Tco need to be controlled to remain between the two limits imposed by the system and its design targets.

For the reasons stated above, and for other reasons stated below which will become apparent to those skilled in the art upon reading and understanding the present specification, there is a need in the art for an output buffer and circuitry which allows the output buffer delay time to be dynamically controlled.

SUMMARY OF THE INVENTION

In one embodiment, output buffer circuitry comprises an output buffer with a controllable delay time, a reference output buffer with a controllable delay time, and a synchronous delay circuit to provide a reference clock signal to the reference output buffer. The reference clock signal calibrates the delay time of both the reference output buffer and the output buffer to a predetermined delay time.

In another embodiment, a method of adjusting a delay time of an output buffer circuit is described. The method comprises receiving an input clock signal, generating a reference clock signal which has a signal transition delayed by a corresponding transition in the clock signal, the delay is equal to 1/N of a period of the input clock signal, adjusting a delay time of a reference output buffer circuit to be equal to 1/N of the period of the input clock signal, and adjusting the delay time of the output buffer circuit based upon the adjusted delay time of the reference output buffer circuit.

DETAILED DESCRIPTION OF THE INVENTION

In the following detailed description of the preferred embodiments, reference is made to the accompanying drawings which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present inventions. The following detailed description is, therefore, not to be taken in a limiting sense, and the scope of the present invention is defined only by the appended claims.

Figure 1:
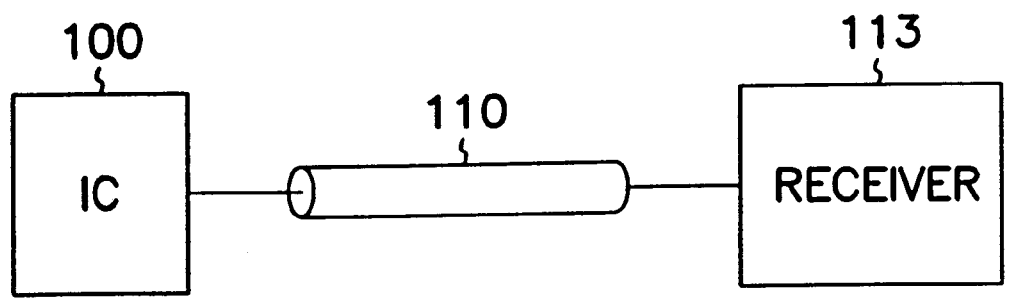
FIG. 1 is an integrated circuit of the present invention coupled to a communication bus.

Referring to FIG. 1, an integrated circuit 100 of the present invention is coupled to a communication line, or bus, 110. A remote end of the bus is coupled to a receiver circuit 113. It will be appreciated that numerous receivers can be coupled to the bus, and that the remote end of the bus may be terminated with circuitry other than a receiver. The bus is illustrated generally as a conductor which is characterized by an impedance and length.

Figure 2:
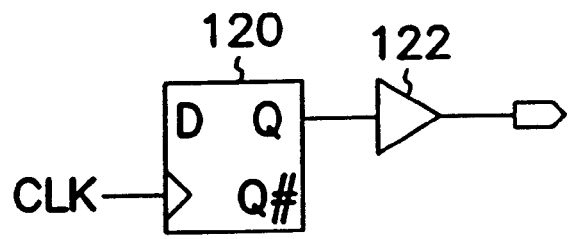
FIG. 2 illustrates a prior art integrated circuit output buffer.

In one embodiment of a prior art integrated circuit output buffer, data is taken from a flip-flop circuit 120 and directly driven from the integrated circuit device using driver circuit 122, see FIG. 2. In another embodiment, the buffer circuit may include some impedance or slew rate control circuitry (not shown). Although impedance and slew rate control circuitry may improve Tco variation, they do not substantially eliminate it. In comparison, the present invention permits improvement to the prior art in the Tco time window. As explained below, the present invention allows the Tco timing to be set dynamically, allowing an integrated circuit to use the optimal setting for the Process, Voltage, and Temperature (PVT) variations under which it is operating.

Figure 3:
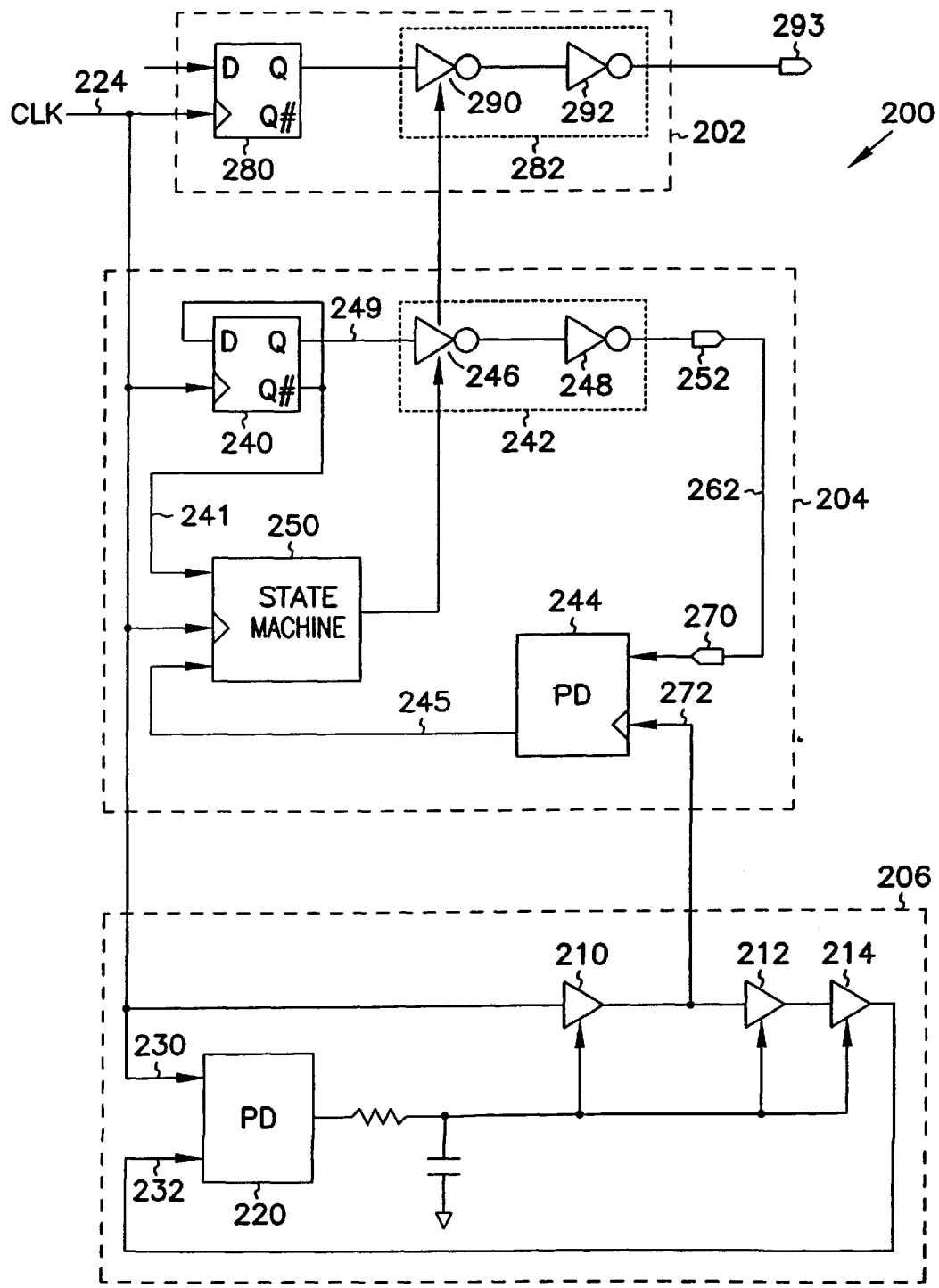
FIG. 3 illustrates one embodiment of an output buffer and control circuitry of the present invention.

Referring to FIG. 3, one embodiment of an output buffer and control circuitry 200 of the present invention is illustrated. The circuitry comprises three sub-circuits, (1) an output buffer 202 with a controllable output delay time, (2) a reference output buffer and feedback control 204, and (3) an optional synchronous delay line 206.

The synchronous delay line 206 includes three controllable delay circuits 210, 212 and 214 coupled to a phase detector 220. The delay circuits are three identical controllable delay elements coupled in series. A bus clock signal 224 is coupled to an input of the first delay circuit. The clock signal is delayed by the elements and the phase detector (PD) compares the arrival times of the bus clock rising edge at input 230 and a predecessor bus clock rising edge delayed by the three delay elements at input 232. If the delayed clock rising edge arrives at the phase detector before the subsequent clock rising edge, then the phase detector increases the delay of the delay elements. If the delayed clock rising edge arrives at the phase detector after the subsequent clock rising edge, then the phase detector decreases the delay of the delay elements. In this manner, the sum of the three delay elements is controlled to match a full clock cycle. The output of the first delay element 210, therefore, is a clock signal delayed by one third of a clock cycle. In one embodiment, the bus clock operates with a cycle time of 7.5 ns. Thus, the delay line generates a reference signal having a 2.5 ns delay. It will be appreciated that the exact delay values depend upon the integrated circuit, and there may be applications where no synchronous delay line is needed, as explained below.

The reference output buffer 204 comprises a flip-flop circuit 240, output buffer circuitry 242, phase detector 244, and a state machine 250. The flip-flop drives a delay tuning buffer 246 which drives an output driver 248 that is coupled to a reference external output pin 252. The output pin drives a length of wire 262 which conveys the output signal back to an external input pin 270. Wire 262 can be any conductive, semiconductive path, or electronic signal path, including but not limited to a conductive trace, poly silicon, and fiber-optic. Upon arriving at the input pin, the arrival time of the reference output is compared with the reference clock signal on input connection 272, generated by the synchronous delay line in this example, using phase detector 244. The output of the phase detector is used by the state machine to make sure that a cumulative delay though the output buffer circuitry 242, Tco, plus the relatively fixed wire delay is equal to 1/3 of the clock cycle. If the signal arrives at the phase detector early, the delay of the delay tuning buffer is increased. Conversely, the delay is decreased if the signal arrives at the phase detector late. Note that flip-flop circuit 240 is coupled to toggle a signal at output Q on each clock signal on node 224 rising edge. The output signal Q 249, therefore, toggles at frequency of ½ of the clock signal. The delay time selected can be described as 1/N of the input clock cycle. It will be appreciated that the integer N is selected based upon the data frequency and the delay of the circuitry used in the output buffer circuitry.

The present invention compares an imprecise output buffer delay from circuit 242 with a more precise clock delay, and uses the result of the comparison to control the output delay. Although wire delays are more precise than output delays, and are independent of the process, voltage, and temperature variations of the output buffer, wire delays still have some variation. In the embodiment described, the synchronous delay line circuit permits a smaller wire delay to be used by generating the delay of 1/N of the clock cycle. If a longer fixed delay (wire delay) were used, the wire delay error would increase. That is, the total wire delay error is directly proportional to the length of the wire connected between external connections 252 and 270. If the error in the external wire is not of concern, the delay line circuit 206 and the phase detector circuit 244 can be eliminated. In this embodiment, state machine 250 adjusts circuits 246 and 290 in response to the cumulative delay of the variable 242 and fixed 262 delay circuits of the reference circuit.

Output buffer 202 illustrated in FIG. 3 uses the same output delay tuning setting that is generated in the reference output buffer and delay loop circuit. That is, the output buffer includes flip-flop 280 and output circuitry 282. The output circuitry is substantially the same as to buffer circuit 242. Delay tuning buffer 290 is the same as delay tuning buffer 246 and uses the output control setting of state machine 250. Likewise, driver 292 is fabricated the same as driver 248.

In one embodiment, this control setting is a digital value which allows for easy distribution around the integrated circuit. Alternatively, an analog controlled delay line can be provided in another embodiment. Because the output buffer 202 and reference output buffer 204 use the same circuitry on the same circuit die, the delay tuning value that controls the reference output provides an optimal delay tuning value for the "normal" output buffers as well.

Figure 4:
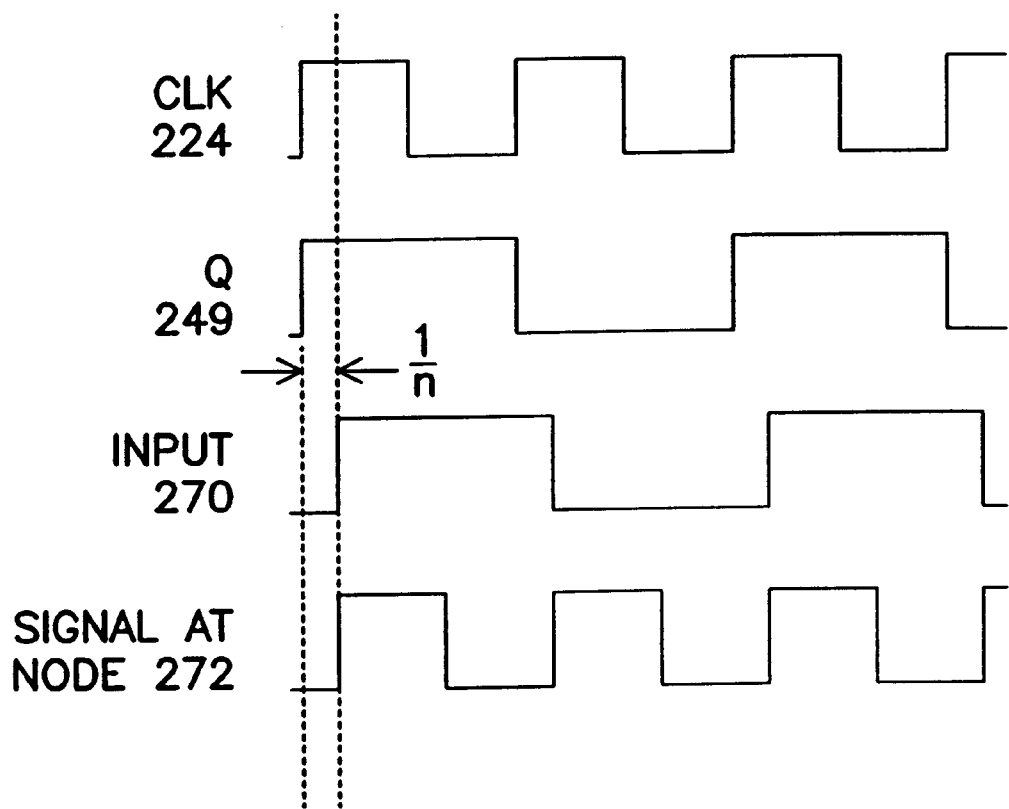
FIG. 4 is a timing diagram of signals of the circuitry of FIG. 3.

FIG. 4 illustrates one example timing diagram of the embodiment illustrated in FIG. 3. As illustrated, CLK signal on node 224 provides an output signal Q 249 that has ½ the frequency of the clock signal. This signal is delayed by circuit 242 and wire 262 to provide an input signal on connection 270 which is delayed by 1/3 the clock frequency. That is, the signal at node 272 is used to control the delay at node 270. It will be appreciated by those skilled in the art, that the delay of 1/3 can be changed without departing from the present invention. Thus, any fraction of the clock signal can be used, such as, but not limited to, 1/8, 1/4, 1/2, 2/3, 3/4. Further, synchronous delay circuit 206 can be eliminated and the delay of circuit 204 can be calibrated using the state machine.

Both the output buffer circuit 202 and the reference circuit 204 include an adjustable buffer circuit 290 and 246, respectively. The embodiment illustrated also includes output driver circuits 248 and 292. The driver circuits are used because it can be more expensive to fabricate a variable driver circuit than a variable buffer coupled to a driver circuit. Also, the input impedance of the driver circuit 292 is more predictable than the impedance at the external connection 293.

Figure 5:
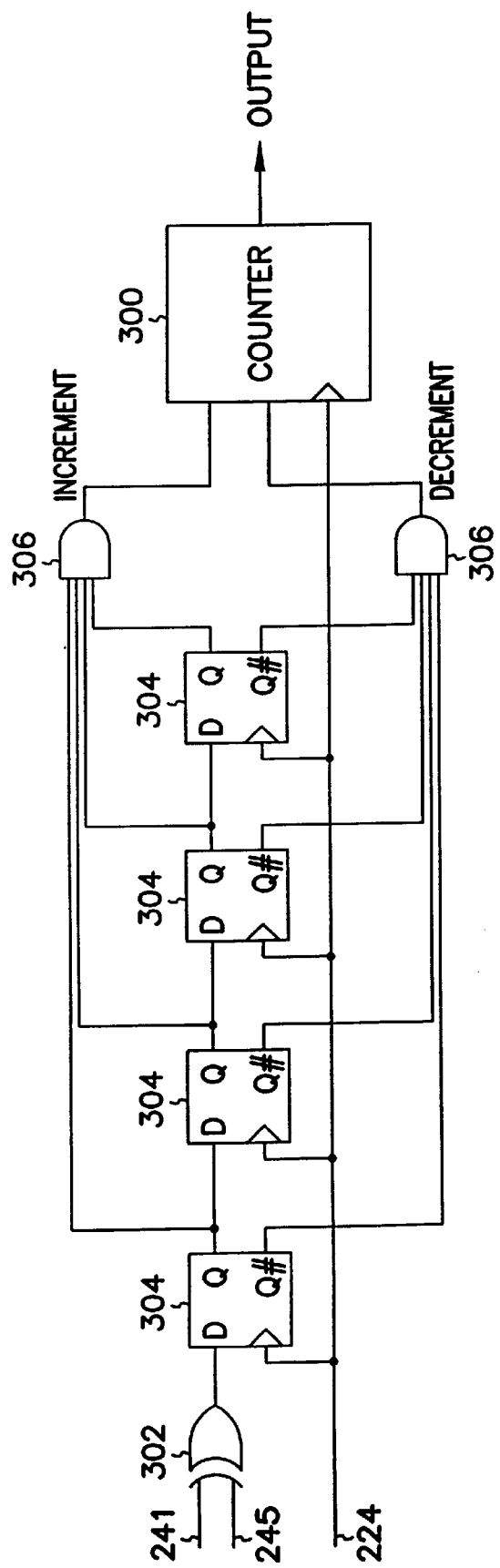
FIG. 5 illustrates one embodiment of state machine of the present invention.

FIG. 5 illustrates one embodiment of state machine 250. The state machine includes a counter 300, an input XNOR gate 302, series coupled flip-flop circuits 304, and a pair of AND gates 306. The state machine compares the values present on nodes 241 and 245 to determine if the delay of the reference output 248 is too slow or too fast. If the delay through 249, 262, 270 to 244 is less than 1/N of a clock cycle; then on the next rising clock and node 241 and 245 will differ. If the loop delay is greater than 1/N of a clock cycle these values will match at the next rising clock edge. In order to reduce the response to noise, the comparison of nodes 241 and 245 is then filtered through the flip-flop circuits for several clock cycles. If several comparisons in a row agree in the direction of the error (too slow or too fast), then the counter that controls the delay of the delay lines is incremented or decremented (using the AND gates) to correct the delay.

The present invention provides a correction of Tco that requires more time than the output delay. Thus, only output delay variations caused by low frequency effects (process, temperature, and low frequency voltage variation) are dynamically corrected. As such, high frequency voltage and simultaneous switching effects are specifically not corrected. There are two dominant terms in Tco variation: (1) process, voltage, and temperature (PVT) effects, and (2) simultaneous switching output (SSO) effects. The present invention compensates for the PVT effects. The magnitude of each type of variation can be explained with the following example.

Assuming that, $Tco_{max}=2.82$ns, $Tco_{min}=1.33$ns, and $Tcom_{max-min}=0.77$ns, where $Tco_{max}$ and $Tco_{min}$ are the maximum and minimum Tco times that are measured under any set of PVT conditions. $Tco_{max-min}$ is the difference between the maximum and minimum Tco measured under a single set of PVT conditions. As such, this difference is dominated by SSO and high frequency voltage effects. If it is assumed that none of the variations measured in $Tco_{max-min}$ can be compensated by the present invention, then the variations that can be compensated for is the remaining variation of 0.72 ns ($Tco_{max}-Tco_{min}-Tco_{max-min}$)

Figure 6:
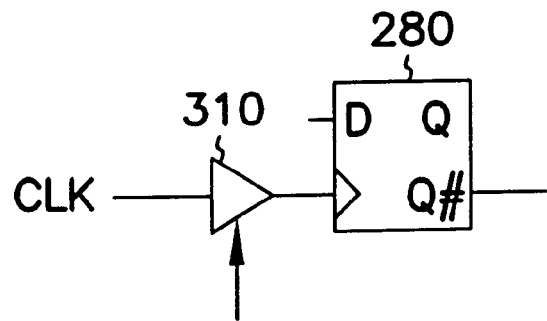
FIG. 6 is an alternate embodiment of portions of an output buffer of the present invention.
Figure 7:
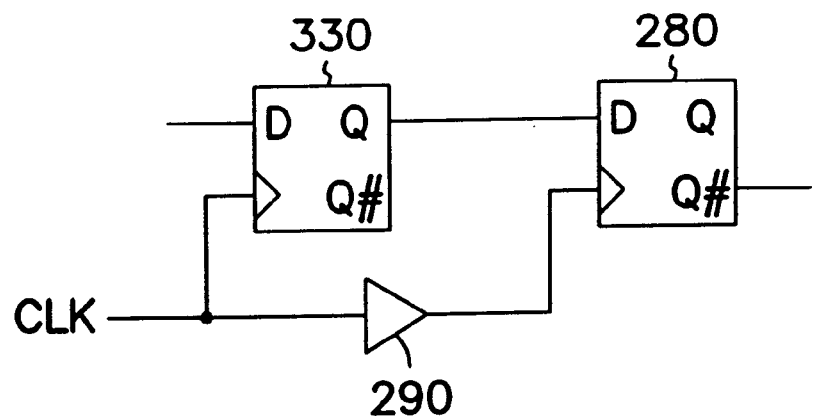
FIG. 7 is an alternate embodiment of portions of an output buffer of the present invention.

FIGS. 6 and 7 illustrate alternate embodiments of the output driver circuit. In the embodiment of FIG. 6, the flip-flop 280 and the delay tuning buffer 290 are replaced with a flip-flop 280 and a non-inverting delay tuning buffer 310 which is coupled such that the delay tuning buffer is coupled to the clock input connection of the flip-flop circuit. The output of the flip-flop is then taken from the Q# connection, not the Q connection. From an output perspective, the circuit of FIG. 6 is equivalent to the circuitry described above. The input (set-up and hold) of this circuit, however, is different from that described above. To overcome this difference, a flip-flop circuit 330 can be added to the input connection of flip-flop circuit 280, as shown in FIG. 7.

Conclusion

An output buffer circuit has been described which has an adjustable delay time. A reference output buffer has also been described which includes an adjustable delay time and a fixed delay time. In one embodiment, a synchronous delay line circuit provides a reference signal having a predetermined delay time. The reference output buffer uses the reference signal from the synchronous delay line circuit to set a cumulative delay time for the reference output buffer equal to the predetermined delay time. The reference output buffer circuit is coupled to the output buffer circuit such that the adjustable delay time of each circuit is set to an equal delay time.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. Output buffer circuitry fabricated on a common integrated circuit comprising:
   an output buffer with a controllable delay time for delaying a data signal;
   a reference output buffer comprising,
      a flip-flop circuit,
      a delay tuning buffer coupled to receive an output from the flip-flop circuit,
      a phase detector circuit coupled to receive an output from the delay tuning buffer,
      a fixed delay electrically located between the delay tuning buffer and the phase detector, the fixed delay comprising an external wire connected to first and second external connections of the integrated circuit, and
      a state machine coupled to an output of the phase detector; and
   a synchronous delay circuit coupled to the reference output buffer, the synchronous delay circuit provides a reference clock signal to the reference output buffer, the reference clock signal calibrates the delay time of both the reference output buffer and the output buffer to a predetermined delay time.

2. The output buffer circuitry of claim 1 wherein the synchronous delay circuit comprises:
   a plurality of delay circuits coupled in series; and
   a phase detector circuit coupled to an output of the plurality of delay circuits.

3. The output buffer circuitry of claim 2 wherein the reference clock signal is provided from an output of one of the plurality of series coupled delay circuits.

4. The output buffer circuitry of claim 2 wherein the plurality of delay circuits comprises three delay circuits, and the clock signal is provided from an output of a first one of the series coupled delay circuits.

5. The output buffer circuitry of claim 1 wherein the output buffer comprises:
   a flip-flop circuit providing an output signal; and
   a tuning buffer circuit coupled to receive the output signal from the flip-flop circuit.

6. The output buffer circuitry of claim 5 further comprising an output driver circuit coupled to an output of the tuning buffer circuit.

7. An integrated circuit comprising:
   a synchronous output buffer circuit having a first input connection for receiving a data signal, and a second input connection for receiving a clock signal, the synchronous output buffer circuit comprises a first tuning buffer circuit having a controllable delay time for delaying a data signal; and
   a reference output buffer circuit having a first input connection for receiving the clock signal, the reference output buffer circuit comprising:
      a second tuning buffer circuit having a controllable delay time,
      an external output connection electrically coupled to receive an output signal from the second tuning buffer circuit,
      an external input connection,
      an external wire coupled between the external output connection and the external input connection to provide a fixed delay element,
      a phase detector circuit having a first input coupled to the external input connection, and a second input coupled to receive a version of the clock signal which is delayed by a fixed fraction of a period of the clock signal, and
      a state machine having an input connection coupled to an output of the phase detector circuit, and an output connection coupled to the first and second tuning buffer circuits to adjust the controllable delay time of the first and second tuning buffer circuits.

8. The integrated circuit of claim 7 wherein the fixed fraction is 1/N, wherein N is an integer, and the version of the clock signal is provided by a delay circuit comprising:
   N series coupled delay circuits having an adjustable delay time, a first one of the N delay circuits has an input coupled to receive the clock signal; and
   a second phase detector circuit having an input coupled to an output of a last one of the N delay circuits, the second phase detector circuit adjusts the delay time of the N series coupled delay circuits such that a cumulative delay time of the series coupled delay circuits, is equal to a cycle of the clock signal.

9. The integrated circuit of claim 8 wherein N equals three.

10. The integrated circuit of claim 7 wherein the reference output buffer circuit further comprises a driver circuit electrically coupled between the second tuning buffer circuit and the external output connection.

11. The integrated circuit of claim 7 wherein the synchronous outputbuffer circuit comprises an output driver circuit coupled to an output connection of the first tuning buffer circuit.

12. A data communication system comprising:
   a data communication bus;
   a data receiving circuit coupled to a first connection of the data communication bus; and
   an integrated circuit comprising output buffer circuitry coupled to the data communication bus, the output buffer circuitry comprises:

a synchronous output buffer circuit having a first input connection for receiving a data signal, and a second input connection for receiving a clock signal, the synchronous output buffer circuit comprises a first buffer circuit having a controllable delay time for delaying a data signal; and a reference output buffer circuit having a first input connection for receiving the clock signal, the reference output buffer circuit comprising:

second buffer circuit having a controllable delay time circuit and a fixed delay time circuit wherein the fixed delay circuit comprises first and second external connections of the integrated circuit and an external wire connected to the first and second external connections, and control circuitry coupled to the second buffer circuit to adjust the controllable delay time of the second buffer circuit such that a cumulative delay time of the controllable delay time circuit and the fixed delay time circuit is equal to 1/N of a period of the clock signal, a control setting provided by the control circuit is coupled to the first and second buffer circuits for adjusting the controllable delay time of the first and second buffer circuits.

13. The data communication system of claim 12 wherein the reference output buffer circuitry further comprises a delay circuit for providing a reference clock signal which is delayed by 1/N of the period of the clock signal.

14. The data communication system of claim 12 wherein N equals three.

15. A method of adjusting a delay time of an output buffer circuit, the method comprising:

receiving an input clock signal;

generating a reference clock signal which has an signal edge transition delayed by a corresponding edge transition in the input clock signal, the delay is equal to 1/N of a period of the input clock signal;

adjusting a delay time for delaying a data signal of a reference output buffer circuit to be substantially equal to 1/N of the period of the input clock signal, wherein the reference output buffer circuit comprises both a first adjustable delay circuit and a fixed delay circuit, and wherein adjusting the delay time of the reference output circuit comprises adjusting the first adjustable delay circuit; and adjusting the delay time of the output buffer circuit based upon the adjusted delay time of the reference output buffer circuit.

16. The method of claim 15 wherein the fixed delay circuit comprises an external wire connected between external connections.

17. The method of claim 16 wherein the output buffer circuit comprises a second adjustable delay circuit which is identical to the first delay circuit, and wherein adjusting the delay time of the output buffer comprises adjusting the second adjustable delay circuit to have the same delay time as the first adjustable delay circuit.

18. The method of claim 15 wherein 1/N equals 1/3 of the period of the input signal.

19. A data communication system comprising:

a data communication bus;

a data receiving circuit coupled to a first connection of the data communication bus; and an integrated circuit comprising output buffer circuitry coupled to the data communication bus, the output buffer circuitry comprises:

a synchronous output buffer circuit having a first input connection for receiving a data signal, and a second input connection for receiving a clock signal, the synchronous output buffer circuit comprises a first buffer circuit having a controllable delay time for delaying a data signal; and a reference output buffer circuit having a first input connection for receiving the clock signal, the reference output buffer circuit comprising:

second buffer circuit having a controllable delay time circuit and a fixed delay time circuit, and control circuitry coupled to the second buffer circuit to adjust the controllable delay time of the second buffer circuit such that a cumulative delay time of the controllable delay time circuit and the fixed delay time circuit is equal to 1/N of a period of the clock signal, a control setting provided by the control circuit is coupled to the first and second buffer circuits for adjusting the controllable delay time of the first and second buffer circuits.

* * * * *